(12) United States Patent
Liu

(10) Patent No.: US 11,705,049 B2
(45) Date of Patent: Jul. 18, 2023

(54) DIFFERENTIAL SIGNAL INTERFACE AND DISPLAY DEVICE ADOPTING THE DIFFERENTIAL SIGNAL INTERFACE

(71) Applicant: TCL CHINA STAR OPTOELECTRONICS TECHNOLOGY CO., LTD., Guangdong (CN)

(72) Inventor: Hanxian Liu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 207 days.

(21) Appl. No.: 16/972,610

(22) PCT Filed: Oct. 19, 2020

(86) PCT No.: PCT/CN2020/121918
§ 371 (c)(1),
(2) Date: Dec. 7, 2020

(87) PCT Pub. No.: WO2022/047903
PCT Pub. Date: Mar. 10, 2022

(65) Prior Publication Data
US 2022/0189379 A1 Jun. 16, 2022

(30) Foreign Application Priority Data
Sep. 3, 2020 (CN) .......................... 202010913143.7

(51) Int. Cl.
*G09G 3/20* (2006.01)

(52) U.S. Cl.
CPC .................................. *G09G 3/2096* (2013.01)

(58) Field of Classification Search
CPC ......... G09G 3/2096; G09G 2320/0693; G09G 2370/08; G09G 2370/16; G09G 3/2092;
(Continued)

(56) References Cited

U.S. PATENT DOCUMENTS 6,208,161 B1 * 3/2001 Suda ..................... H04L 25/028
326/86
6,545,534 B1 4/2003 Mehr
(Continued)

FOREIGN PATENT DOCUMENTS

| CN | 101241685 A | 8/2008 |
| CN | 101751902 A | 6/2010 |

(Continued)

*Primary Examiner* — Temesghen Ghebretinsae
*Assistant Examiner* — Karin Kiyabu
(74) *Attorney, Agent, or Firm* — PV IP PC; Wei Te Chung; Zhigang Ma

(57) ABSTRACT

The present application provides a differential signal interface and a display device adopting the differential signal interface. A plurality of different differential signals are transmitted between a transmitting end and a receiving end of the differential signal interface by a plurality of differential pairs. A plurality of moderating modules are disposed between the transmitting end and the receiving end. Each moderating module is connected to a corresponding differential pair and is configured to adjust the impedance of the transmitting end and/or the receiving end such that the impedance of the transmitting end and/or the receiving end matches the impedance of the corresponding differential pair.

10 Claims, 3 Drawing Sheets

(58) Field of Classification Search
CPC ........ H03K 19/0175; H03K 19/017545; G06F 13/4086
USPC .......................................................... 326/30
See application file for complete search history.

(56) References Cited

U.S. PATENT DOCUMENTS

| | | | | |
|---|---|---|---|---|
| 8,279,206 | B2 * | 10/2012 | Ryu | .................... H03K 17/687 326/86 |
| 2004/0075636 | A1 | 4/2004 | Pai | |
| 2008/0238442 | A1 * | 10/2008 | Ryu | ....................... G09G 5/006 324/629 |

FOREIGN PATENT DOCUMENTS

| | | | |
|---|---|---|---|
| CN | 202931466 | U | 5/2013 |
| CN | 106604550 | A | 4/2017 |
| CN | 107045861 | A | 8/2017 |
| CN | 209374035 | U * | 9/2019 |
| CN | 209374035 | U | 9/2019 |
| CN | 110827782 | A | 2/2020 |
| CN | 111243552 | A | 6/2020 |
| JP | 2009122318 | A | 6/2009 |
| KR | 20080089868 | A | 10/2008 |

* cited by examiner

DIFFERENTIAL SIGNAL INTERFACE AND DISPLAY DEVICE ADOPTING THE DIFFERENTIAL SIGNAL INTERFACE

FIELD OF THE DISCLOSURE

The present application relates to display technologies, and more particularly to a differential signal interface and a display device adopting the differential signal interface.

DESCRIPTION OF RELATED ARTS

Nowadays, a mini low-voltage differential signal (mini-LVDS) interface is usually adopted to transmit signals between a timing control board and a display panel of a display device. The quality of transmission signals is often measured by eye pattern.

The mini-LVDS has no ability to carry out eye pattern adjustment for each received signal. Accordingly, for signals transmitted from a same end, input and output impedance matching varies between transmitting ends/receiving ends and a transmission line. This causes a transmission signal to be reflected at the transmitting end or the receiving end such that there are differences between eye patterns of signals received at different receiving ends. For the transmission lines of different materials and lengths, the eye patterns of some transmission signals cannot meet the requirements of the specification. The eye patterns with poor quality often cause display abnormalities such as and these will affect display effect. For transmission lines of different materials and lengths, the eye diagrams of some transmission signals cannot meet the requirements of the specification, and poor-quality eye diagrams often cause display abnormalities, such as blurry, no image, and color spots, which affect the display effect.

TECHNICAL PROBLEMS

The existing approach to adjusting the eye pattern of the transmission signal is to adjust the amplitude of the mini-LVDS differential signal, or to pre-emphasize jump bits to compensate for a loss of high-frequency components caused by the jump on the transmission lines. However, these approaches may cause electromagnetic interference (EMI) problems.

TECHNICAL SOLUTIONS

In order to improve the quality of eye pattern of transmission signals, the present application provides a differential signal interface and a display device adopting the differential signal interface.

In a first aspect, the present application provides a differential signal interface, comprising a transmitting end and a receiving end that are disposed opposite to each other, the transmitting end transmitting differential signals to the receiving end by using a plurality of differential pairs, wherein the differential signal interface further comprises a plurality of moderating modules, each of the moderating modules is disposed between the transmitting end and the receiving end and is connected to a corresponding differential pair, and each of the moderating modules is configured to adjust impedance of the transmitting end and/or the receiving end such that the impedance of the transmitting end and/or the receiving end matches the impedance of the corresponding differential pair. each of the moderating modules is configured to adjust impedance of the transmitting end and/or the receiving end such that the impedance of the transmitting end and/or the receiving end matches the impedance of the corresponding differential pair.

In some embodiments, the moderating module is disposed close to the transmitting end and/or the receiving end, and the moderating module comprises a detecting unit, a comparing unit and an adjusting unit that are connected in sequence, wherein the detecting unit is configured to detect the impedance of the corresponding differential pair and the impedance of the transmitting end and/or the receiving end; wherein the comparing unit is configured to compare the impedance of the corresponding differential pair and the impedance of the transmitting end and/or the receiving end to determine a matching relation between the impedance of the corresponding differential pair and the impedance of the transmitting end and/or the receiving end; and wherein the adjusting unit is configured to adjust the impedance of the transmitting end and/or the receiving end based on the matching relation.

In some embodiments, the "adjusting the impedance of the transmitting end and/or the receiving end based on the matching relation" comprises:

increasing the impedance of the transmitting end and/or the receiving end to the impedance of the corresponding differential pair if the matching relation indicates that the impedance of the transmitting end and/or the receiving end is greater than the impedance of the corresponding differential pair; and decreasing the impedance of the transmitting end and/or the receiving end to the impedance of the corresponding differential pair if the matching relation indicates that the impedance of the transmitting end and/or the receiving end is less than the impedance of the corresponding differential pair.

In some embodiments, each of the differential pairs comprises a first signal line and a second signal line that are disposed parallel to each other, and the adjusting unit comprises two first adjustable resistors and two second adjustable resistors;

one of the two first adjustable resistors is connected in series on the first signal line, the other one of the two first adjustable resistors is connected in series on the second signal line, and the two first adjustable resistors are configured to increase the impedance of the transmitting end and/or the receiving end; and a first terminal of one of the two second adjustable resistors is connected to the first signal line, the first terminal of the other one of the two second adjustable resistors is connected to the second signal line, a second terminal of the two second adjustable resistors is grounded, and the two second adjustable resistors are configured to decrease the impedance of the transmitting end and/or the receiving end.

In some embodiments, the "increasing the impedance of the transmitting end and/or the receiving end to the impedance of the corresponding differential pair" comprises increasing resistance of the two first adjustable resistors based on a difference between the impedance of the transmitting end and/or the receiving end and the impedance of the corresponding differential pair such that the impedance of the transmitting end and/or the receiving end increases to the impedance of the corresponding differential pair; and the "decreasing the impedance of the transmitting end and/or the receiving end to the impedance of the corresponding differential pair" comprises increasing the resistance of the two second adjustable resistors based on a difference between the impedance of the transmitting end and/or the receiving end and the impedance of the corresponding differential pair such that the impedance of the transmitting end and/or the receiving end decreases to the impedance of the corresponding differential pair.

In some embodiments, the adjusting unit comprises a third adjustable resistor, and a first terminal of the third adjustable resistor is connected to the first signal line and a second terminal of the third adjustable resistor is connected to the second signal line.

In some embodiments, the third adjustable resistor is disposed close to the transmitting end and/or the receiving end.

In some embodiments, the adjusting unit comprises a programmable potentiometer connected to the first adjustable resistor, the second adjustable resistor and the third adjustable resistor and configured to adjust resistance of the first adjustable resistor, the second adjustable resistor and the third adjustable resistor.

In some embodiments, the programmable potentiometer adjusts the resistance of the first adjustable resistor, the second adjustable resistor and the third adjustable resistor by setting the resistance using a register or by assigning the resistance using an external signal.

In some embodiments, the differential signal interface is any one of a low-voltage differential signal interface (LVDS), a mini-LVDS interface and a V-by-one (VBO) interface.

In a second aspect, the present application further provides a display device, comprising a timing controller, a display panel and a differential signal interface, wherein the display panel is provided with a source driver in a non-display region of the display panel, a transmitting end of the differential signal interface is connected to the timing controller and a receiving end of the differential signal interface is connected to the source driver of the display panel, wherein the differential signal interface includes the transmitting end and the receiving end that are disposed opposite to each other, the transmitting end transmits differential signals to the receiving end by using a plurality of differential pairs, and wherein the differential signal interface further includes a plurality of moderating modules, each of the moderating modules is disposed between the transmitting end and the receiving end and is connected to a corresponding differential pair, and each of the moderating modules is configured to adjust impedance of the transmitting end and/or the receiving end such that the impedance of the transmitting end and/or the receiving end matches the impedance of the corresponding differential pair.

In some embodiments, the moderating module is disposed close to the transmitting end and/or the receiving end, and the moderating module includes a detecting unit, a comparing unit and an adjusting unit that are connected in sequence, wherein the detecting unit is configured to detect the impedance of the corresponding differential pair and the impedance of the transmitting end and/or the receiving end;

wherein the comparing unit is configured to compare the impedance of the corresponding differential pair and the impedance of the transmitting end and/or the receiving end to determine a matching relation between the impedance of the corresponding differential pair and the impedance of the transmitting end and/or the receiving end; and wherein the adjusting unit is configured to adjust the impedance of the transmitting end and/or the receiving end based on the matching relation.

In some embodiments, the "adjusting the impedance of the transmitting end and/or the receiving end based on the matching relation" includes:

increasing the impedance of the transmitting end and/or the receiving end to the impedance of the corresponding differential pair if the matching relation indicates that the impedance of the transmitting end and/or the receiving end is greater than the impedance of the corresponding differential pair; and decreasing the impedance of the transmitting end and/or the receiving end to the impedance of the corresponding differential pair if the matching relation indicates that the impedance of the transmitting end and/or the receiving end is less than the impedance of the corresponding differential pair.

In some embodiments, each of the differential pairs includes a first signal line and a second signal line that are disposed parallel to each other, and the adjusting unit includes two first adjustable resistors and two second adjustable resistors;

one of the two first adjustable resistors is connected in series on the first signal line, the other one of the two first adjustable resistors is connected in series on the second signal line, and the two first adjustable resistors are configured to increase the impedance of the transmitting end and/or the receiving end; and a first terminal of one of the two second adjustable resistors is connected to the first signal line, the first terminal of the other one of the two second adjustable resistors is connected to the second signal line, a second terminal of the two second adjustable resistors is grounded, and the two second adjustable resistors are configured to decrease the impedance of the transmitting end and/or the receiving end.

In some embodiments, the "increasing the impedance of the transmitting end and/or the receiving end to the impedance of the corresponding differential pair" includes increasing resistance of the two first adjustable resistors based on a difference between the impedance of the transmitting end and/or the receiving end and the impedance of the corresponding differential pair such that the impedance of the transmitting end and/or the receiving end increases to the impedance of the corresponding differential pair; and the "decreasing the impedance of the transmitting end and/or the receiving end to the impedance of the corresponding differential pair" includes increasing the resistance of the two second adjustable resistors based on a difference between the impedance of the transmitting end and/or the receiving end and the impedance of the corresponding differential pair such that the impedance of the transmitting end and/or the receiving end decreases to the impedance of the corresponding differential pair.

In some embodiments, the adjusting unit includes a third adjustable resistor, and a first terminal of the third adjustable resistor is connected to the first signal line and a second terminal of the third adjustable resistor is connected to the second signal line.

In some embodiments, the third adjustable resistor is disposed close to the transmitting end and/or the receiving end.

In some embodiments, the adjusting unit includes a programmable potentiometer connected to the first adjustable resistor, the second adjustable resistor and the third adjustable resistor and configured to adjust resistance of the first adjustable resistor, the second adjustable resistor and the third adjustable resistor.

In some embodiments, the programmable potentiometer adjusts the resistance of the first adjustable resistor, the second adjustable resistor and the third adjustable resistor by setting the resistance using a register or by assigning the resistance using an external signal.

In some embodiments, the differential signal interface is any one of a low-voltage differential signal interface (LVDS), a mini-LVDS interface and a V-by-one (VBO) interface.

Beneficial Effects

In the differential signal interface and the display device adopting the differential signal interface provided in the present application, a plurality of different differential signals are transmitted between the transmitting end and the receiving end of the differential signal interface by using a plurality of differential pairs. A plurality of moderating modules are disposed between the transmitting end and the receiving end. Each moderating module is connected to a corresponding differential pair and is configured to adjust the impedance of the transmitting end and/or the receiving end such that the impedance of the impedance of the transmitting end and/or the receiving end matches the impedance of the corresponding differential pair, thereby improving the quality of eye pattern of the differential signals received at the receiving end and improving transmission efficiency. Utilizing the differential signal interface to connect the source driver of the display panel and the timing controller of the display device can improve the quality of eye pattern of display signals, prevent the display signals from being distorted and improve the display quality of the display device. In the differential signal interface and the display device adopting the differential signal interface provided in the present application, a plurality of different differential signals are transmitted between the transmitting end and the receiving end of the differential signal interface by using a plurality of differential pairs. A plurality of moderating modules are disposed between the transmitting end and the receiving end. Each moderating module is connected to a corresponding differential pair and is configured to adjust the impedance of the transmitting end and/or the receiving end such that the impedance of the impedance of the transmitting end and/or the receiving end matches the impedance of the corresponding differential pair, thereby improving the quality of eye pattern of the differential signals received at the receiving end and improving transmission efficiency. Utilizing the differential signal interface to connect the source driver of the display panel and the timing controller of the display device can improve the quality of eye pattern of display signals, prevent the display signals from being distorted and improve the display quality of the display device.

DESCRIPTION OF EMBODIMENTS OF THE DISCLOSURE

Figure 1:
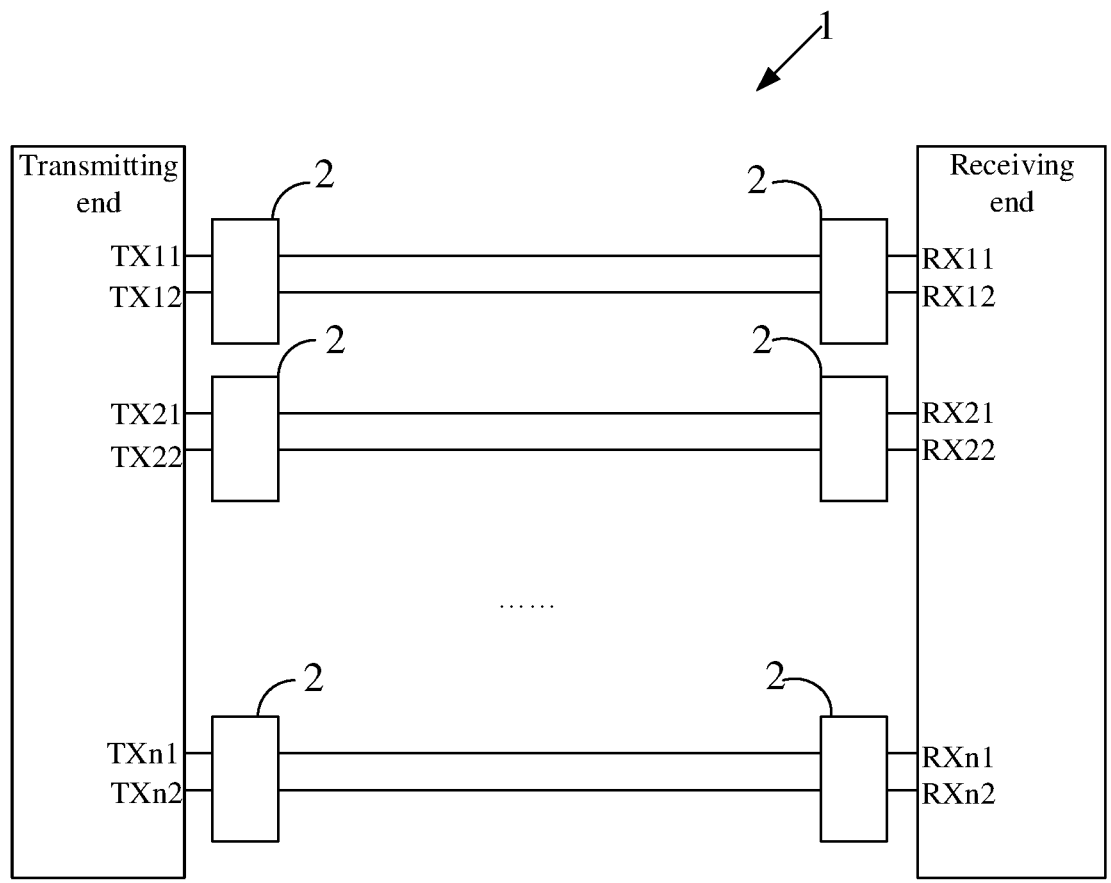
FIG. 1 is a structural schematic diagram showing a differential signal interface 1 provided in an embodiment of the present application.

To make the objectives, technical schemes, and effects of the present application more clear and specific, the present application is described in further detail below with reference to the embodiments in accompanying with the appending drawings. It should be understood that the specific embodiments described herein are merely for interpreting the present application and the present application is not limited thereto.

Impedance matching is Primarily used for transmission lines. By this, transmitting all high-frequency microwave signals to a loaded point can be achieved, and there is almost no signal reflected back to the source, thereby improving transmission efficiency. The internal resistance of a signal source is equal in size and phase to the characteristic impedance of a transmission line connected to the signal source or the characteristic impedance of the transmission line is equal in size and phase to the impedance of a load connected to the transmission line. These cases are referred to that the transmission line is located in an impedance matched state at an input end or an output end, respectively. It is abbreviated as impedance matching.

Approaches to the impedance matching primarily include connecting resistors in series or in parallel at a signal source side or a load side. The use of the connected-in-series resistors is called connected-in-series terminal matching. For example, when the driving ability of the signal source is not strong such that the internal resistance of the signal source is lower than the characteristic impedance of the transmission line, a resistor can be connected in series between the signal source and the transmission line such that the output impedance of the signal source matches the characteristic impedance of the transmission line, thereby preventing the signal reflected from the load side from being reflected again. The use of the connected-in-parallel resistor is called connected-in-parallel terminal matching. When the impedance of the signal source is very small, the input impedance of the load side may match the characteristic impedance of the transmission line by connecting a resistor in parallel at the load side, thereby eliminating the reflection at the load side.

High-frequency signals are used in display devices. Since the high-frequency signals are with high frequencies and short wavelengths, the reflection of the transmission line needs to be considered. When the wavelength is as short as the length of the transmission line, the reflected signal and the original signal will change the shape of the original signal after being superimposed. If the characteristic impedance of the transmission line is not equal to or does not match the impedance of the signal source or the load, reflections will occur at the load side. This will affect the quality of the eye pattern of the transmission signal and cause the transmission signal to be distorted.

To solve above problems, an embodiment of the present application provides a differential signal interface. A signal source is called a transmitting end and a load is called a receiving end.

FIG. 1 is a structural schematic diagram showing a differential signal interface 1 according to an embodiment of the present application. As shown in FIG. 1, the differential signal interface includes the transmitting end and the receiving end that are disposed opposite to each other. The transmitting end transmits differential signals to the receiving end by using a plurality of differential pairs. The differential signal interface 1 further includes a plurality of moderating modules 2. Each moderating module 2 is disposed between the transmitting end and the receiving end and is connected to a corresponding differential pair. Each moderating module 2 is configured to adjust the impedance of the transmitting end and/or the receiving end such that the impedance of the transmitting end and/or the receiving end matches the impedance of the corresponding differential pair.

Specifically, the transmitting end of the differential signal interface 1 transmits the differential signals to the receiving end by using n differential pairs, where n is a positive integer. Each differential pair includes two signal lines. For example, the transmitting end of a first differential pair is taken by TX11 and TX12 and its receiving end is taken by RX11 and RX12 correspondingly; the transmitting end of a second differential pair is taken by TX21 and TX22 and its receiving end is taken by RX21 and RX22 correspondingly; . . . ; and the transmitting end of an n-th differential pair is taken by TXn1 and TXn2 and its receiving end is taken by RXn1 and RXn2 correspondingly. Each differential signal is transmitted by using two signal lines of one differential pair for enhancing the ability to resist interference and redundancy.

Further, the differential signal interface 1 has a moderating module 2 disposed for each differential pair. The moderating module 2 is disposed between the transmitting end and the receiving end and is connected to a corresponding differential pair. When the impedance of the transmitting end or the receiving end of any differential pair does not match the impedance of a corresponding differential pair, the impedance of the transmitting end or the receiving end is adjusted by using the moderating module 2 connected with the differential pair such that the impedance of the transmitting end or the receiving end matches the impedance of the corresponding differential pair. In such a way, the signal transmitted by the differential pair will not be reflected from the receiving end such that transmission of different differential signals is achieved by adjusting the impedance of the transmitting end or the receiving end, thereby improving compatibility of different differential signals.

The differential signal interface 1 provided in the embodiment of the present application transmits a plurality of different differential signals between the transmitting end and the receiving end by using a plurality of differential pairs. A plurality of moderating modules 2 are disposed between the transmitting end and the receiving end. Each moderating module 2 is connected to a corresponding differential pair and is configured to adjust the impedance of the transmitting end and/or the receiving end such that the impedance of the impedance of the transmitting end and/or the receiving end matches the impedance of the corresponding differential pair, thereby improving the quality of eye pattern of the differential signals received at the receiving end and improving transmission efficiency.

Figure 2:
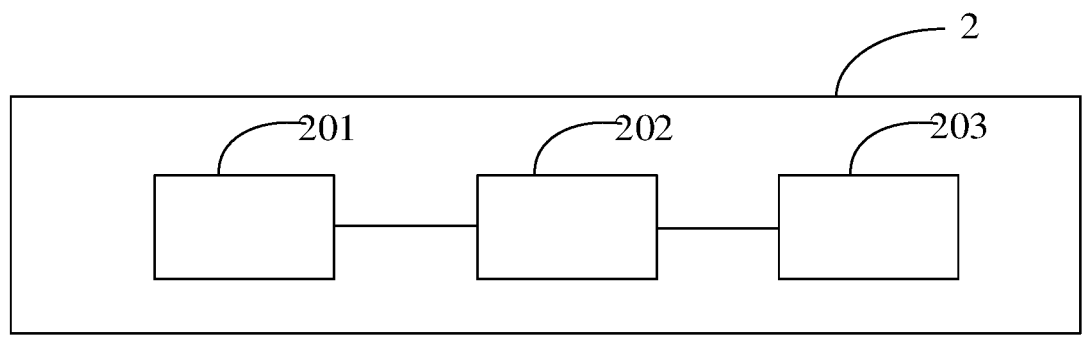
FIG. 2 is a structural schematic diagram showing a moderating module of any differential pair of a differential signal interface provided in an embodiment of the present application.

FIG. 2 is a structural schematic diagram showing the moderating module 2 of any differential pair of the differential signal interface 1 provided in an embodiment of the present application. As shown in FIG. 2, the moderating module 2 is disposed close to the transmitting end and/or the receiving end, and the moderating module 2 includes a detecting unit 201, a comparing unit 202 and an adjusting unit 203 that are connected in sequence. The detecting unit 201 is configured to detect the impedance of the corresponding differential pair and the impedance of the transmitting end and/or the receiving end. The comparing unit 202 is configured to compare the impedance of the corresponding differential pair and the impedance of the transmitting end and/or the receiving end to determine a matching relation between the impedance of the corresponding differential pair and the impedance of the transmitting end and/or the receiving end. The adjusting unit 203 is configured to adjust the impedance of the transmitting end and/or the receiving end based on the matching relation between the impedance of the corresponding differential pair and the impedance of the transmitting end and/or the receiving end.

It can be understood that for ease of adjusting the impedance of the transmitting end and the receiving end, the moderating module 2 is disposed closed to the transmitting end or the receiving end in the differential signal interface 1. The moderating module 2 close to the transmitting end is configured to adjust the impedance of the transmitting end and the moderating module 2 close to the receiving end is configured to adjust the impedance of the receiving end. In addition, the moderating module 2 may be disposed only at the transmitting end or only at the receiving end; the moderating modules 2 may also be disposed at both the transmitting end and the receiving end to adjust the impedance of the transmitting end and the receiving end individually.

Specifically, at first, each moderating module 2 utilizes the detecting unit 201 to detect the impedance of the transmitting end or the receiving end and the impedance of the corresponding differential pair. Then, the comparing unit 202 is utilized to compare the impedance of the transmitting end or the receiving end and the impedance of the corresponding differential pair to determine a matching relation therebetween. Finally, the moderating module 2 adjusts the impedance of the transmitting end or the receiving end based on the matching relation between the impedance of the transmitting end or the receiving end and the impedance of the corresponding differential pair such that the impedance of the transmitting end or the receiving end matches the impedance of the corresponding differential pair.

The adjusting unit 203 adjusts the impedance of the transmitting end or the receiving end based on the matching relation between the impedance of the transmitting end or the receiving end and the impedance of the corresponding differential pair. Specifically, this operation includes the followings.

The impedance of the transmitting end and/or the receiving end increases to the impedance of the corresponding differential pair if the matching relation indicates that the impedance of the transmitting end and/or the receiving end is less than the impedance of the corresponding differential pair.

The impedance of the transmitting end and/or the receiving end decreases to the impedance of the corresponding differential pair if the matching relation indicates that the impedance of the transmitting end and/or the receiving end is greater than the impedance of the corresponding differential pair.

Figure 3:
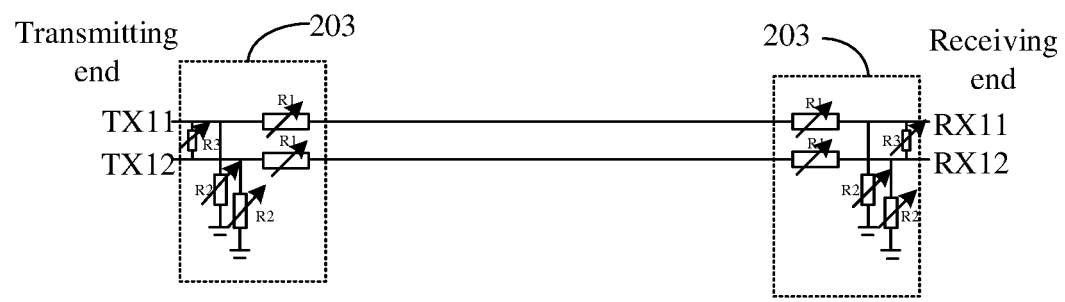
FIG. 3 is a structural schematic diagram showing an adjusting unit of a moderating module provided in an embodiment of the present application.

FIG. 3 is a structural schematic diagram showing the adjusting unit 203 of the moderating module 2 provided in an embodiment of the present application. Each differential pair includes a first signal line and a second signal line that are disposed parallel to each other. For example, the first signal line is located between the transmitting end TX11 and the receiving end RX11 and the second signal line is located between the transmitting end TX12 and the receiving end RX12; the first signal line is located between the transmitting end TX21 and the receiving end RX21 and the second signal line is located between the transmitting end TX22 and the receiving end RX22; . . . . ; and the first signal line is located between the transmitting end TXn1 and the receiving end RXn1 and the second signal line is located between the transmitting end TXn2 and the receiving end RXn2.

The adjusting unit 203 includes two first adjustable resistors R1 and two second adjustable resistors R2.

One of the two first adjustable resistors R1 is connected in series on the first signal line, the other one of the two first adjustable resistors R1 is connected in series on the second signal line, and the two first adjustable resistors R1 are configured to increase the impedance of the transmitting end and/or the receiving end.

A first terminal of one of the two second adjustable resistors R2 is connected to the first signal line, the first terminal of the other one of the two second adjustable resistors R2 is connected to the second signal line, a second terminal of the two second adjustable resistors R2 is grounded, and the two second adjustable resistors R2 are configured to decrease the impedance of the transmitting end and/or the receiving end.

Specifically, one of the two first adjustable resistors R1 of each adjusting unit 203 is connected in series on the first signal line and the other one of the two first adjustable resistors R1 is connected in series on the second signal line, for increasing the impedance of the transmitting end or the receiving end; one of the two second adjustable resistors R2 is connected in parallel to the first signal line and is ground and the other one of the two second adjustable resistors R2 is connected in parallel to the second signal line and is grounded, for decreasing the impedance of the transmitting end or the receiving end. In such a way, by adjusting the impedance of the transmitting end or the receiving end, the impedance of the transmitting end or the receiving end can match the impedance of the differential pair connected to the moderating module 2 to which the adjusting unit 203 belongs.

If the impedance of the transmitting end and/or the receiving end is less than the impedance of the corresponding differential pair, the resistance of the two first adjustable resistors R1 increases based on a difference between the impedance of the transmitting end and/or the receiving end and the impedance of the corresponding differential pair such that the impedance of the transmitting end and/or the receiving end increases to the impedance of the corresponding differential pair.

If the impedance of the transmitting end and/or the receiving end is greater than the impedance of the corresponding differential pair, the resistance of the two second adjustable resistors R2 increases based on a difference between the impedance of the transmitting end and/or the receiving end and the impedance of the corresponding differential pair such that the impedance of the transmitting end and/or the receiving end decreases to the impedance of the corresponding differential pair.

Further, as shown in FIG. 3, the adjusting unit 203 includes a third adjustable resistor R3, and a first terminal of the third adjustable resistor R3 is connected to the first signal line and a second terminal of the third adjustable resistor R3 is connected to the second signal line. The third adjustable resistor R3 is disposed close to the transmitting end and/or the receiving end and this can avoid signal reflection occurred at the transmitting end and/or the receiving end in a further step.

It is noted that the first adjustable resistor R1, the second adjustable resistor R2 and the third adjustable resistor R3 can be actually one or a plurality of combinations of a resistor, a capacitor and an inducer. It can be configured by oneself according to the needs.

In some embodiments, the adjusting unit 203 includes a programmable potentiometer (not shown) connected to the first adjustable resistor R1, the second adjustable resistor R2 and the third adjustable resistor R3 and configured to adjust the resistance of the first adjustable resistor R1, the second adjustable resistor R2 and the third adjustable resistor R3.

Specifically, the programmable potentiometer adjusts the resistance of the first adjustable resistor R1, the second adjustable resistor R2 and the third adjustable resistor R3 by setting the resistance using a register or by assigning the resistance using an external signal.

It can be understood that the differential signal interface provided in afore-described embodiments can be any one of a low-voltage differential signal interface (LVDS), a mini-LVDS interface and a V-by-one (VBO) interface.

Figure 4:
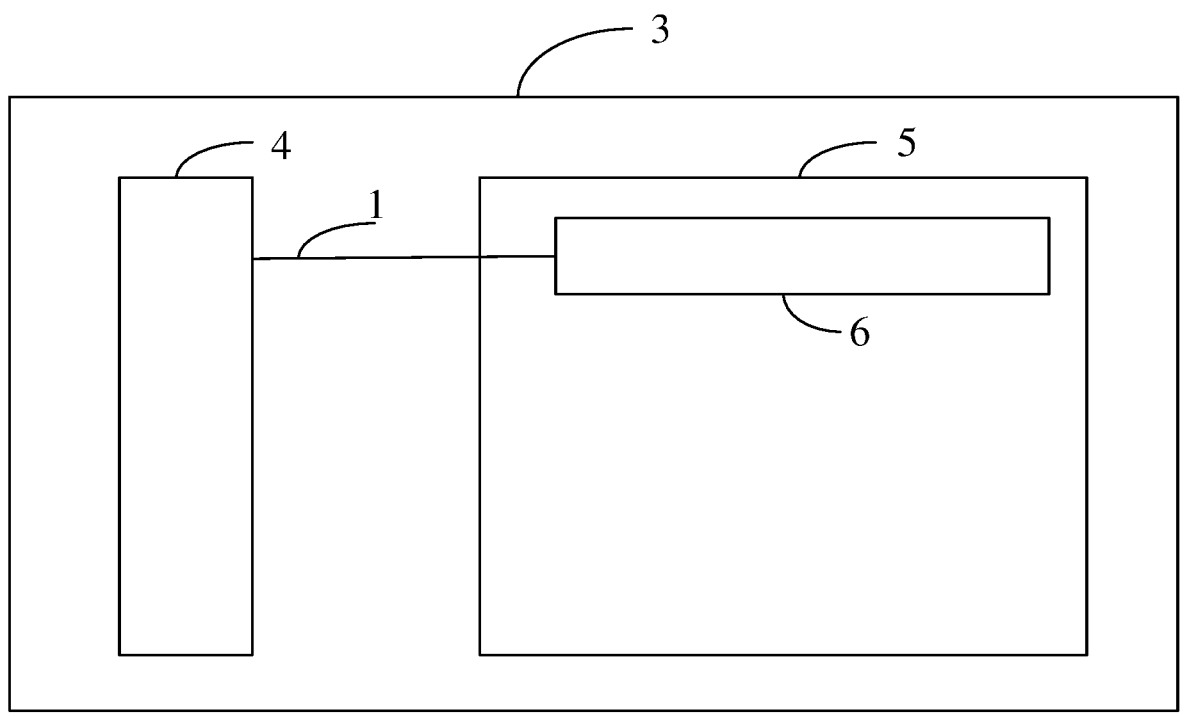
FIG. 4 is a structural schematic diagram showing a display device provided in an embodiment of the present application.
Figure 5:
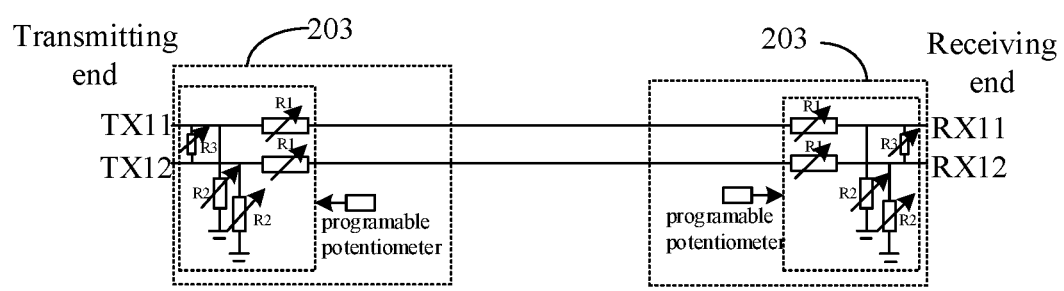
FIG. 5 is a structural schematic diagram illustrating an adjusting unit of a moderating module including the programmable potentiometer.

FIG. 4 is a structural schematic diagram showing a display device provided in an embodiment of the present application. As shown in FIG. 4, the present application further provides a display device 3. The display device 3 includes a timing controller 4, a display panel 5 and the aforesaid differential signal interface 1. The display panel 5 is provided with a source driver 6 in a non-display region of the display panel. The transmitting end of the differential signal interface 1 is connected to the timing controller 4 and the receiving end of the differential signal interface 1 is connected to the timing controller 4 of the display panel 5.

Specifically, the timing controller 4 of the display device 3 conveys signals to the receiving end from the transmitting end of the differential signal interface 1 and then the receiving end transmits a control signal and pixel data to the source driver 6 of the display panel 5.

After inspecting the eye pattern of transmission signals of the differential signal interface 1, it can be known that the differential signal interface 1 is capable of greatly reducing signal reflection and overshoot for the signals received at the receiving end, thereby improving signal transmission efficiency and preventing the signals from being distorted during the transmission. The display panel adopting the differential signal interface can be adaptive to different frequencies of differential signals and yields an excellent display effect.

It should be understood that those of ordinary skill in the art may make equivalent modifications or variations according to the technical schemes and invention concepts of the present application, but all such modifications and variations should be within the appended claims of the present application.

The invention claimed is:

1. A differential signal interface, comprising a transmitting end and a receiving end that are disposed opposite to each other, the transmitting end transmitting differential signals to the receiving end by using a plurality of differential pairs, wherein the differential signal interface further comprises a plurality of moderating modules, each of the moderating modules is disposed between the transmitting end and the receiving end and is connected to a corresponding differential pair, and each of the moderating modules is configured to adjust impedance of the transmitting end and/or the receiving end such that the impedance of the transmitting end and/or the receiving end matches an impedance of the corresponding differential pair;

wherein the moderating modules are disposed close to the transmitting end and/or the receiving end, each of the moderating modules comprises an adjusting unit, and the adjusting unit is configured to adjust the impedance of the transmitting end and/or the receiving end based on a matching relation between the impedance of the corresponding differential pair and the impedance of the transmitting end and/or the receiving end;

wherein the adjusting unit is configured to: increase the impedance of the transmitting end and/or the receiving end to the impedance of the corresponding differential pair if the matching relation indicates that the impedance of the transmitting end and/or the receiving end is less than the impedance of the corresponding differential pair; and decrease the impedance of the transmitting end and/or the receiving end to the impedance of the corresponding differential pair if the matching relation indicates that the impedance of the transmitting end and/or the receiving end is greater than the impedance of the corresponding differential pair;

wherein each of the differential pairs comprises a first signal line and a second signal line that are disposed parallel to each other, and the adjusting unit comprises two first adjustable resistors, two second adjustable resistors, a third adjustable resistor, and a programmable potentiometer;

one of the two first adjustable resistors is connected in series on the first signal line, the other one of the two first adjustable resistors is connected in series on the second signal line, and the two first adjustable resistors are configured to increase the impedance of the transmitting end and/or the receiving end;

a first terminal of one of the two second adjustable resistors is connected to the first signal line, a first terminal of the other one of the two second adjustable resistors is connected to the second signal line, a second terminal of the two second adjustable resistors is grounded, and the two second adjustable resistors are configured to decrease the impedance of the transmitting end and/or the receiving end;

a first terminal of the third adjustable resistor is connected to the first signal line and a second terminal of the third adjustable resistor is connected to the second signal line; and the programmable potentiometer is connected to the first adjustable resistors, the second adjustable resistors and the third adjustable resistor and configured to adjust resistance of the first adjustable resistors, the second adjustable resistors and the third adjustable resistor.

2. The differential signal interface according to claim 1, wherein the adjusting unit is configured to increase resistance of the two first adjustable resistors based on a difference between the impedance of the transmitting end and/or the receiving end and the impedance of the corresponding differential pair to increase the impedance of the transmitting end and/or the receiving end to the impedance of the corresponding differential pair such that the impedance of the transmitting end and/or the receiving end increases to the impedance of the corresponding differential pair; and wherein the adjusting unit is configured to increase the resistance of the two second adjustable resistors based on a difference between the impedance of the transmitting end and/or the receiving end and the impedance of the corresponding differential pair to decrease the impedance of the transmitting end and/or the receiving end to the impedance of the corresponding differential pair such that the impedance of the transmitting end and/or the receiving end decreases to the impedance of the corresponding differential pair.

3. The differential signal interface according to claim 1, wherein the third adjustable resistor is disposed close to the transmitting end and/or the receiving end.

4. The differential signal interface according to claim 1, wherein the programmable potentiometer adjusts the resistance of the first adjustable resistors, the second adjustable resistors and the third adjustable resistor by setting the resistance using a register or by assigning the resistance using an external signal.

5. The differential signal interface according to claim 1, wherein the differential signal interface is any one of a low-voltage differential signal interface (LVDS), a mini-LVDS interface and a V-by-one (VBO) interface.

6. A display device, comprising a timing controller, a display panel and a differential signal interface, wherein the display panel is provided with a source driver in a non-display region of the display panel, a transmitting end of the differential signal interface is connected to the timing controller and a receiving end of the differential signal interface is connected to the source driver of the display panel, wherein the differential signal interface comprises the transmitting end and the receiving end that are disposed opposite to each other, the transmitting end transmits differential signals to the receiving end by using a plurality of differential pairs, and wherein the differential signal interface further comprises a plurality of moderating modules, each of the moderating modules is disposed between the transmitting end and the receiving end and is connected to a corresponding differential pair, and each of the moderating modules is configured to adjust impedance of the transmitting end and/or the receiving end such that the impedance of the transmitting end and/or the receiving end matches an impedance of the corresponding differential pair;

wherein the moderating modules are disposed close to the transmitting end and/or the receiving end, each of the moderating modules comprises an adjusting unit, and the adjusting unit is configured to adjust the impedance of the transmitting end and/or the receiving end based on a matching relation between the impedance of the corresponding differential pair and the impedance of the transmitting end and/or the receiving end;

wherein the adjusting unit is configured to: increase the impedance of the transmitting end and/or the receiving end to the impedance of the corresponding differential pair if the matching relation indicates that the impedance of the transmitting end and/or the receiving end is less than the impedance of the corresponding differential pair; and decrease the impedance of the transmitting end and/or the receiving end to the impedance of the corresponding differential pair if the matching relation indicates that the impedance of the transmitting end and/or the receiving end is greater than the impedance of the corresponding differential pair;

wherein each of the differential pairs comprises a first signal line and a second signal line that are disposed parallel to each other, and the adjusting unit comprises two first adjustable resistors, two second adjustable resistors, a third adjustable resistor, and a programmable potentiometer;

one of the two first adjustable resistors is connected in series on the first signal line, the other one of the two first adjustable resistors is connected in series on the second signal line, and the two first adjustable resistors are configured to increase the impedance of the transmitting end and/or the receiving end;

a first terminal of one of the two second adjustable resistors is connected to the first signal line, a first terminal of the other one of the two second adjustable resistors is connected to the second signal line, a second terminal of the two second adjustable resistors is grounded, and the two second adjustable resistors are configured to decrease the impedance of the transmitting end and/or the receiving end;

a first terminal of the third adjustable resistor is connected to the first signal line and a second terminal of the third adjustable resistor is connected to the second signal line; and the programmable potentiometer is connected to the first adjustable resistors, the second adjustable resistors and the third adjustable resistor and configured to adjust resistance of the first adjustable resistors, the second adjustable resistors and the third adjustable resistor.

7. The display device according to claim 6, wherein the adjusting unit is configured to increase resistance of the two first adjustable resistors based on a difference between the impedance of the transmitting end and/or the receiving end and the impedance of the corresponding differential pair to increase the impedance of the transmitting end and/or the receiving end to the impedance of the corresponding differential pair such that the impedance of the transmitting end and/or the receiving end increases to the impedance of the corresponding differential pair; and wherein the adjusting unit is configured to increase the resistance of the two second adjustable resistors based on a difference between the impedance of the transmitting end and/or the receiving end and the impedance of the corresponding differential pair to decrease the impedance of the transmitting end and/or the receiving end to the impedance of the corresponding differential pair such that the impedance of the transmitting end and/or the receiving end decreases to the impedance of the corresponding differential pair.

8. The display device according to claim 6, wherein the third adjustable resistor is disposed close to the transmitting end and/or the receiving end.

9. The display device according to claim 6, wherein the programmable potentiometer adjusts the resistance of the first adjustable resistors, the second adjustable resistors and the third adjustable resistor by setting the resistance using a register or by assigning the resistance using an external signal.

10. The display device according to claim 6, wherein the differential signal interface is any one of a low-voltage differential signal interface (LVDS), a mini-LVDS interface and a V-by-one (VBO) interface.

* * * * *